US009864001B2

(12) United States Patent
Hsu et al.

(10) Patent No.: US 9,864,001 B2
(45) Date of Patent: Jan. 9, 2018

(54) ELECTRONIC DEVICE AND TESTING SYSTEM

(71) Applicants: Jui-Hung Hsu, Taipei (TW); Li-Hsin Wang, Taipei (TW); Ping-Yueh Hsieh, Taipei (TW); Yi-Da Chen, Taipei (TW); Jhu-Jyun Chang, Taipei (TW); Hou-Lung Lin, Taipei (TW)

(72) Inventors: Jui-Hung Hsu, Taipei (TW); Li-Hsin Wang, Taipei (TW); Ping-Yueh Hsieh, Taipei (TW); Yi-Da Chen, Taipei (TW); Jhu-Jyun Chang, Taipei (TW); Hou-Lung Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 9 days.

(21) Appl. No.: 14/751,141

(22) Filed: Jun. 26, 2015

(65) Prior Publication Data
US 2015/0377942 A1 Dec. 31, 2015

Related U.S. Application Data

(60) Provisional application No. 62/017,831, filed on Jun. 26, 2014.

(51) Int. Cl.
*G01R 31/28* (2006.01)
(52) U.S. Cl.
CPC ...... *G01R 31/2818* (2013.01); *G01R 31/2806* (2013.01)
(58) Field of Classification Search
CPC ...... G01R 31/28; G01R 31/282; G01R 27/32; G01R 31/001; G01R 31/002

USPC .......................................................... 324/612
See application file for complete search history.

(56) References Cited

U.S. PATENT DOCUMENTS

| 8,581,606 | B2 | 11/2013 | Kim | |
|---|---|---|---|---|
| 2013/0289923 | A1* | 10/2013 | Mizutani | G01R 31/282 702/117 |
| 2013/0297954 | A1* | 11/2013 | Martin | G06F 13/4247 713/310 |

(Continued)

FOREIGN PATENT DOCUMENTS

| TW | M338996 | 8/2008 |
|---|---|---|
| TW | 201025730 | 7/2010 |

OTHER PUBLICATIONS

Dissanayake, S. D., et al. "Zigbee wireless vehicular identification and authentication system." 2008 4th International Conference on Information and Automation for Sustainability. IEEE, 2008.*

(Continued)

*Primary Examiner* — Jermele M Hollington
*Assistant Examiner* — Christopher McAndrew
(74) *Attorney, Agent, or Firm* — JCIPRNET

(57) ABSTRACT

An electronic device is provided. The electronic device includes a printed circuit board (PCB), an antenna structure, a radio frequency signal transceiving circuit and a testing structure. The antenna structure is disposed on the PCB. The radio frequency signal transceiving circuit is disposed on the PCB, and is connected to the antenna structure through a conductive line. The testing structure includes a testing point and a grounding structure. The testing point is disposed on the conductive line, and the grounding structure is disposed on the PCB.

4 Claims, 2 Drawing Sheets

(56) References Cited

U.S. PATENT DOCUMENTS

2013/0307560 A1*  11/2013  Horie ............... H05K 1/111
                                              324/537
2014/0055155 A1*  2/2014   Li .................. G01R 31/3025
                                              324/754.03
2014/0125363 A1*  5/2014   Bock ............... G01R 31/31715
                                              324/750.02

OTHER PUBLICATIONS

Copani, Tino, et al. "A CMOS low-power transceiver with reconfigurable antenna interface for medical implant applications." IEEE Transactions on Microwave Theory and Techniques 59.5 (2011): 1369-1378.*

"Office Action of Taiwan Counterpart Application", dated May 10, 2016, p. 1-p. 5.

* cited by examiner

ELECTRONIC DEVICE AND TESTING SYSTEM

CROSS-REFERENCE TO RELATED APPLICATION

This application claims the priority benefit of U.S. provisional application Ser. No. 62/017,831, filed on Jun. 26, 2014. The entirety of the above-mentioned patent application is hereby incorporated by reference herein and made a part of this specification.

BACKGROUND OF THE INVENTION

1. Field of the Invention

The invention relates to an electronic device, and relates particularly to an electronic device and a testing system including the electronic device.

2. Description of Related Art

Generally speaking, in a conventional design of a portable electronic device, an antenna element is typically disposed at a corner or an edge of the portable electronic device. A distance between the antenna element and a motherboard may differ according to overall designs of different electronic devices. The antenna and the motherboard are generally connected by mating the terminal connector of a coaxial cable extending from the antenna with a corresponding connector base on the mother board, so as to achieve a bridging of a radio frequency signal. Then, manufacturer of the portable electronic device may use the connector base to detect/test a high frequency radio frequency signal generated by wireless communications equipment. However, along with improvements in the light, thin and miniaturized trends of portable electronic devices and further, under consideration of cost, the antenna equipped in the portable electronic device is gradually changing to be integrally disposed on the main circuit board, using a manufacturing process for a printed circuit board to print the antenna, which is simple and economical. In this way, the connector could also be neglected.

In order to test the emitting capability of the radio frequency signal, many portable electronic device manufacturers will directly acquire the electromagnetic wave radiated out by the antenna as a measurement data. However, this method produces a large variation in the measurements and does not have high stability; therefore problems arise during inspection for mass productions and affect the yield. As a result, in order to stably measure the radio frequency signal generated by the portable electronic device, typically a high frequency switch is disposed between the antenna element and a radio frequency signal transceiver module of the portable electronic device. The external appearance of the high frequency switch and the method of use is similar to the above connector base; when a probe of a measurement device and the high frequency switch are connected, the switch will cut-off the path that is originally connected to the antenna unit, such that the radio frequency signal generated by the radio frequency signal transceiver module will switch to flow towards a new feed-in path that directs to the measurement device, achieving an objective of measuring the signal.

However, after testing is completed, the additionally disposed high frequency switch is no use to a user when using the portable electronic device. In addition to the extra cost burden, and further under the consideration that designs of portable electronic devices are continuing to advance towards a light and slim trend, disposing an additionally element on a printed circuit board may also cause difficulty when disposing other components. Therefore, when portable electronic devices are inspected during mass production, a simple method for how to accurately detect the radio frequency signal on the board end has become an issue for research and discussion by manufacturers.

SUMMARY OF THE INVENTION

The invention provides an electronic device and a testing system, which accurately detects a radio frequency signal transmitted by an antenna unit in the electronic device, and does not require a high frequency switch to be disposed.

The electronic device of the invention includes a printed circuit board, an antenna structure, a radio frequency signal transceiving circuit and a testing structure. The antenna structure is disposed on the printed circuit board. The radio frequency signal transceiving circuit is disposed on the printed circuit board, and is connected to the antenna structure through a conductive line. The testing structure includes a testing point and a grounding structure. The testing point is disposed on the conductive line, and the grounding structure is disposed on the printed circuit board.

The testing system of the invention includes an electronic device and a testing device. The electronic device includes a testing structure disposed on a printed circuit board, wherein the testing structure includes a testing point and a grounding structure, and the testing point is disposed on a conductive line connecting between an antenna structure and a radio frequency signal transceiving circuit. The testing device includes a probe. Wherein, the probe is connected to the testing point, so as to measure a radio frequency signal emitted by the radio frequency signal transceiving circuit. An extended grounding terminal of the probe is electrically connected with the grounding structure.

Based on the above, the invention provides an electronic device and a testing system including the electronic device. Through the testing structure disposed on the electronic device, the connection to the testing point in the testing structure could be easily made to obtain the radio frequency signal desired to be measured, and at the same time through the connection of the grounding structure and the testing device, the resonance capability of the antenna structure is suppressed, the accuracy when performing measurements from the testing point could be further increased.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
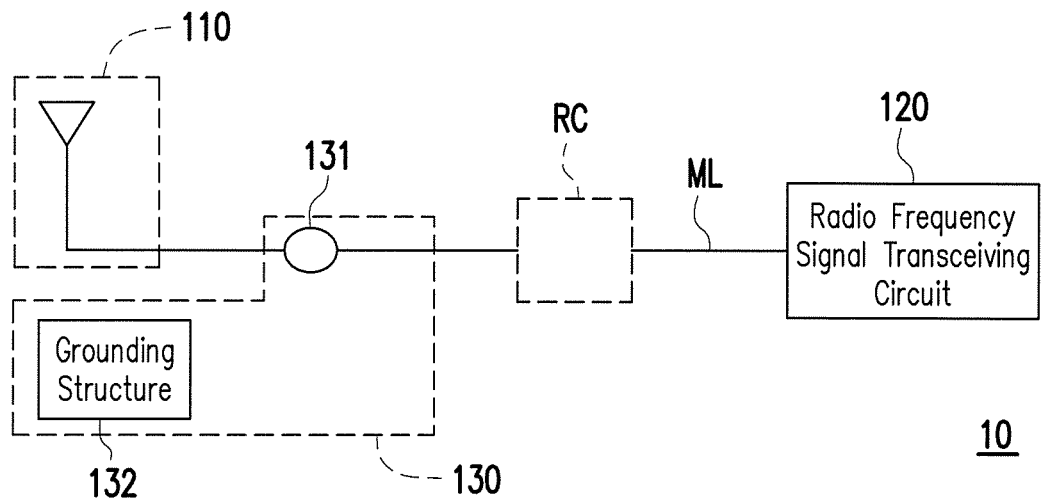
FIG. 1 is a schematic diagram illustrating an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating an electronic device according to an embodiment of the invention. Referring to FIG. 1, an electronic device 10 includes an antenna structure 110, a radio frequency signal transceiving circuit 120 and a testing structure 130. Herein, the antenna structure 110 and the radio frequency signal transceiving circuit 120 are disposed on a printed circuit board (PCB), and the radio frequency signal transceiving circuit 120 is connected to the antenna structure 110 through a conductive line ML. The testing structure 130 includes a testing point 131 and a grounding structure 132. The testing point 131 is disposed on the conductive line ML, and the grounding structure 132 is disposed on the PCB. The testing point 131 is a metal contact and may be used to be connected with a probe of a testing device. In conventional techniques, the testing point 131 may be disposed near a high frequency switch (as shown in FIG. 1 a high frequency switch RC is illustrated by dotted lines, meaning not disposed) in order to connect together with the probe of the testing device. It should be noted that the electronic device 10 shown in FIG. 1 is only for showing functional components in the electronic device 10 and a coupling relationship between the components, however the configuration of the components in the electronic device 10 are not limited to be disposed in the relative positions shown in FIG. 1.

In an embodiment of the invention, a testing system of the invention includes the electronic device 10 shown in FIG. 1 and a testing device. The testing device includes a probe, wherein the probe may be connected with the testing point 131 when testing, so as to measure a radio frequency signal emitted by the radio frequency signal transceiving circuit 120. The probe includes a signal receiving terminal and an extended grounding terminal, wherein the extended grounding terminal may be electrically connected to the grounding structure 132, such that a resonance capability of the antenna structure 110 could be suppressed, the accuracy when performing measurements from the testing point 131 could be further increased. The grounding structure and a connecting relationship inside the electronic device between the testing structure and the testing device when testing will be described according to an embodiment of the invention in detail below.

Figure 2A:
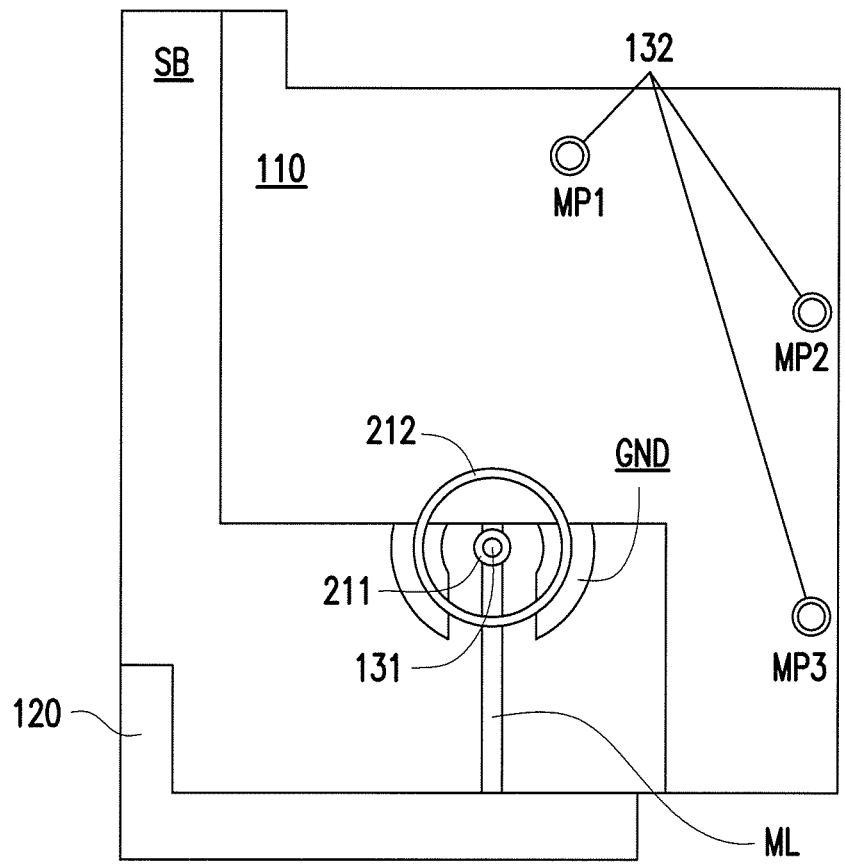
FIG. 2A is a schematic diagram illustrating a configuration of an electronic device according to an embodiment of the invention.
Figure 2B:
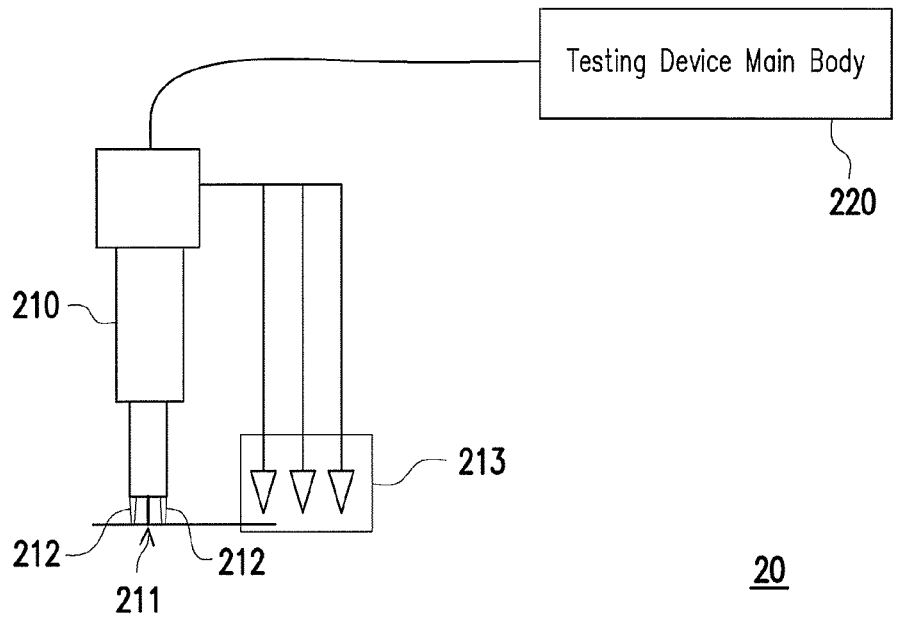
FIG. 2B is a schematic diagram illustrating a configuration of a testing device according to an embodiment of the invention.

FIG. 2A is a schematic diagram illustrating a configuration of an electronic device according to an embodiment of the invention. FIG. 2B is a schematic diagram illustrating a configuration of a testing device according to an embodiment of the invention. A configuration for actually disposing the components on a printed circuit board SB is shown in FIG. 2A. Referring to FIG. 2A, in the present embodiment, the radio frequency signal transceiving circuit 120 may be implemented through a chip disposed on the printed circuit board SB. The radio frequency signal transceiving circuit 120 may be used to generate or receive a radio frequency signal. The radio frequency signal may be a wireless LAN signal that complies with wireless fidelity (WiFi), and also may be a long term evolution (LTE) or such wireless telecommunications network signal or the like complying with 3G or 4G mobile communications standards, and should not be construed as a limitation to the invention.

The antenna structure 110 is disposed in a clearance area on the printed circuit board SB, and for example, printed on the printed circuit board SB using a printed circuit board manufacturing process. Reference may be made to FIG. 2A for an area occupied on the printed circuit board SB by the antenna structure 110. The radio frequency signal transceiving circuit 120 is connected with the antenna structure 110 through the conductive line ML (for example, a signal microstrip line printed by a printed circuit board manufacturing process). In the present embodiment, the testing point 131 is disposed on the conductive line ML, wherein a grounding pad GND is disposed on the printed circuit board SB at a periphery of the testing point 131. Furthermore, in the present embodiment, the grounding structure 132 in the testing structure 130 includes 3 metal contacts MP1~MP3 disposed so as to be electrically connected with the antenna structure 110.

On the other hand, referring to FIG. 2B, a testing device 20 includes a probe 210 and a testing device main body 220. The probe 210 further includes a signal receiving terminal 211, a ground terminal 212 and an extended grounding terminal 213. The ground terminal 212 may be a circular contact. A relationship of the signal receiving terminal 211 and the ground terminal 212 of the probe 210 is similar to that of an inner shaft and an outer edge of a coaxial cable. The extended grounding terminal 213 has at least one end, wherein the number thereof corresponds to the number of metal contacts in the grounding structure. For example, in the present embodiment, the extended grounding terminal 213 has 3 ends, corresponding to the 3 metal contacts MP1~MP3 of the grounding structure respectively. In addition, the extended grounding terminal 213 and the ground terminal 212 are electrically connected to an interior of the probe 210.

Referring to FIG. 2A and FIG. 2B, when testing is performed, the signal receiving terminal 211 of the probe 210 may be connected with the testing point 131. At the same time, the ground terminal 212 of the probe 210 is connected with the grounding pad GND on the printed circuit board SB. In addition, the 3 ends of the extended grounding terminal 213 are also connected with the 3 metal contacts MP1~MP3 of the grounding structure 132.

When testing, the testing device main body 220 may receive the radio frequency signal emitted by the radio frequency signal transceiving circuit 120 through the signal receiving terminal 211 and the ground terminal 212 of the probe 210. It should be noted that at this time, the antenna structure 110 and the radio frequency signal transceiving circuit 120 still retain electrical connection. Although, at this time the path between the radio frequency signal transceiving circuit 120 to the antenna structure 110 is not blocked, such that a part of the energy also may flow into the antenna structure 110. However, since the antenna structure 110 at this time is grounded (namely, grounded through the electrical connection of the extended grounding terminal 213, the ground terminal 212 and the grounding pad GND that is on the printed circuit board SB) through the 3 metal contacts MP1~MP3 in the grounding structure 132, such that the capability of the antenna structure 110 to resonate to generate radiating modes is suppressed at this time. In this way, the energy flowing into the antenna structure 110 also may be fed back to the testing device 20, such that a large part of the energy of the radio frequency signal emitted by the radio frequency signal transceiving circuit 120 may be fed into the testing device main body 220 through the probe 210. Furthermore, an operator of the testing device 20 may determine whether the signal emitting capability of the radio frequency signal transceiving circuit 120 in the electronic device 10 is good or bad through measuring the energy of the radio frequency signal that is fed in.

It should be noted, in the present embodiment, the metal contacts MP1~MP3 in the grounding structure 132 and the corresponding ends of the extended grounding terminal 213 are shown to be 3, however the number of the metal contacts in the grounding structure is only required to be at least one, and the actual number of the metal contacts may be increased or decreased according to actual requirements. For example, in an embodiment of the invention, the antenna structure 110 is a single frequency planar inverted F antenna (PIFA) structure. 2 metal contacts are disposed in the grounding structure and are respectively connected to the signal feeding point and an open end of a radiation part (namely, an end of the antenna structure) of the PIFA structure. In this way, the capability of the antenna structure 110 to resonate to generate radiating modes is suppressed to the minimum when testing is performed.

In another embodiment, the antenna structure 110 is a dual frequency PIFA structure transceiving a high frequency signal and a low frequency signal. 3 metal contacts are correspondingly disposed in the grounding structure and are respectively connected to the feeding point of the antenna structure, the open end corresponding to an excitation path of the high frequency signal and the open end corresponding to an excitation path of the low frequency signal. In the invention, the metal contact also may be disposed so as to be connected with other parts of a radiating body in the antenna structure, and the invention should not be limited to the above embodiments.

Figure 3:
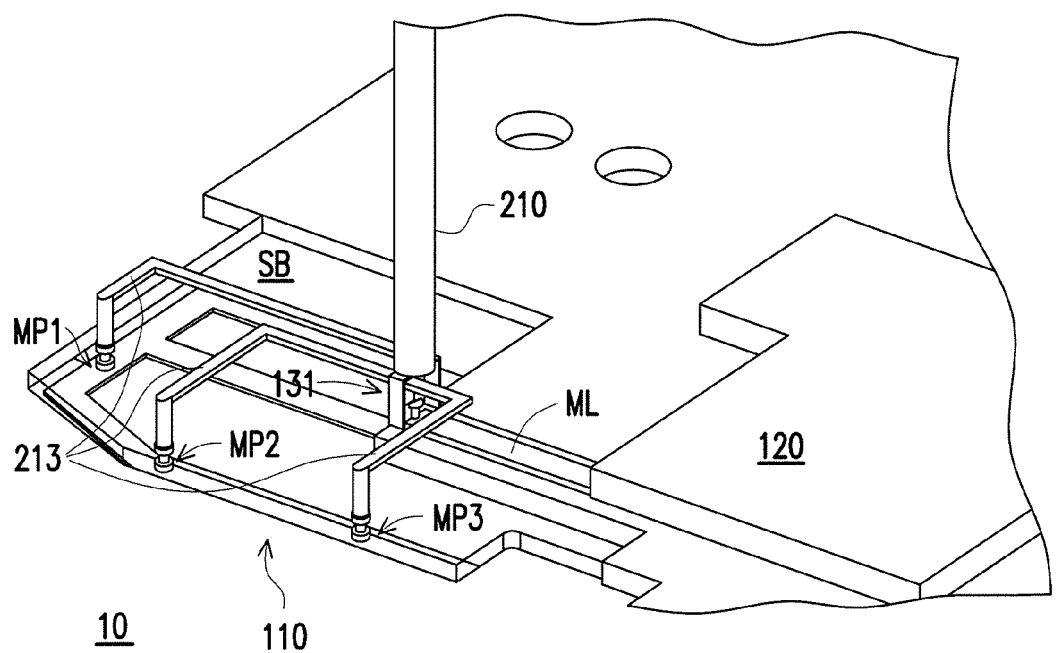
FIG. 3 is a schematic diagram illustrating an electronic device and a testing device connected inside a testing system according to an embodiment of the invention.

FIG. 3 is a schematic diagram illustrating an electronic device and a testing device connected inside a testing system according to an embodiment of the invention. Referring to FIG. 3, reference may be made to the embodiments of FIG. 2A and FIG. 2B for the coupling relationships and the configuration of the components when testing, and will not be repeated here. It should be noted that in the present embodiment, the antenna structure 110 is not disposed on the same surface of the printed circuit board SB as with the radio frequency signal transceiving circuit 120. Namely, as shown in FIG. 3, the radio frequency signal transceiving circuit 120 is disposed on an upper surface of the printed circuit board SB (for example, a first surface of the printed circuit board SB) and the antenna structure 110 is disposed on a bottom surface of the printed circuit board SB (for example, a second surface of the printed circuit board SB). Therefore, in present embodiment, the metal contacts MP1~MP3 are respectively connected with the antenna structure 110 through vias.

In addition, in the present embodiment, the probe 210 is disposed in the testing structure 130 corresponding to the relative position relationship of the testing point 131 and the metal contacts MP1~MP3 of the grounding structure, such that the testing system has higher stability and repeatability such that the testing (namely, measuring the radio frequency signal through the connection of the probe 210 with the electronic device 10) may be performed stably and repeated many times.

In summary, the invention provides an electronic device having a testing structure and a testing system including the electronic device, such that under the circumstance where there is an antenna load, the testing system may measure the energy of the radio frequency signal emitted by the electronic device in a way that is highly repeatable and also has high stability. In the invention, the testing device in the testing system may capture the radio frequency signal desired to be measured by connecting the probe with the testing point reserved on the signal microstrip line, and at the same time suppressing the resonance radiation ability of the antenna structure in the electronic device using the extended grounding terminal connected with the grounding structure on the electronic device, such that the energy of the radio frequency signal which flows to the antenna structure may be fed back to the testing device, further increasing the accuracy of the radio frequency signal measured from the testing point. It may be seen through testing, a variance in the energy of the radio frequency signal obtained by the measurement of the testing device may be maintained within 10%. Wherein, the variance referred to here may correspond to the measurement of a tolerance value of a gauge repeatability and reproducibility (Gauge R&R) test that is performed using analysis of variance (ANOVA), namely, this tolerance value may be maintained within 10%. In addition, since a high frequency switch does not need to be additionally disposed in the invention, the cost of the high frequency switch may therefore be saved. Furthermore, since the high frequency switch is not required to be disposed, the printed circuit board may be used more effectively, and the configuration of the components on the printed circuit board may have even more flexibility.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic device, comprising:
a printed circuit board;
an antenna structure, disposed on the printed circuit board;
a radio frequency signal transceiving circuit, disposed on the printed circuit board, and connected to the antenna structure through a conductive line;
a testing structure, comprising:
a testing point, disposed on the conductive line; and
a grounding structure, disposed on the printed circuit board,
wherein a probe is connected to the testing point so as to measure a radio frequency signal emitted by the radio frequency signal transceiving circuit, wherein the antenna structure and the radio frequency signal transceiving circuit are electrically connected to each other at the same time;
an extended grounding terminal of the probe is electrically connected with the grounding structure;
the grounding structure comprises at least one metal contact, wherein the at least one metal contact is electrically connected with the antenna structure;
the antenna structure is grounded through the extended grounding terminal of the probe;
the at least one metal contact comprises a first metal contact and a second metal contact; and
the first metal contact is electrically connected to a signal feeding point of a radiation part in the antenna structure and the second metal contact is electrically connected to an open end of the radiation part in the antenna structure, wherein the testing structure is disposed on a first surface of the printed circuit board; and the antenna structure is disposed on a second surface of the printed circuit board, wherein the at least one metal contact is electrically connected with the antenna structure through at least one via respectively.

2. The electronic device as claimed in claim 1, wherein the conductive line is a signal microstrip line.

3. A testing system, comprising:
an electronic device, comprising:
  a testing structure disposed on a printed circuit board, wherein the testing structure comprises:
    a testing point and a grounding structure, wherein the testing point is disposed on a conductive line connecting between an antenna structure and a radio frequency signal transceiving circuit; and
a testing device, comprising:
  a probe,
wherein the probe is connected to the testing point, so as to measure a radio frequency signal emitted by the radio frequency signal transceiving circuit, and the antenna structure and the radio frequency signal transceiving circuit are electrically connected to teach other at the same time;
an extended grounding terminal of the probe is electrically connected with the grounding structure;

the grounding structure in the electronic device comprises:
  at least one metal contact, wherein the at least one metal contact is electrically connected to the antenna structure in the electronic device; and
  the antenna structure in the electronic device is grounded through the extended grounding terminal of the probe;
wherein the at least one metal contact comprises a first metal contact and a second metal contact; and
the first metal contact is electrically connected to a signal feeding point of a radiation part in the antenna structure and the second metal contact is electrically connected to an open end of the radiation part in the antenna structure, wherein
  the testing structure of the electronic device is disposed on a first surface of the printed circuit board; and
  the antenna structure of the electronic device is disposed on a second surface of the printed circuit board, wherein the at least one metal contact is electrically connected with the antenna structure through at least one via respectively.

4. The testing system as claimed in claim 3, wherein the conductive line is a signal microstrip line.

\* \* \* \* \*